US012760435B2

(12) United States Patent
Shailendar et al.

(10) Patent No.: US 12,760,435 B2
(45) Date of Patent: *Oct. 13, 2026

(54) ELECTROPHORETICALLY-DEPOSITED MASKS ON ELECTRODE ARRAYS

(71) Applicant: Fabric8Labs, Inc., San Diego, CA (US)

(72) Inventors: Shiv Shailendar, San Diego, CA (US); Kareemullah Shaik, San Diego, CA (US); Sean Stone, San Diego, CA (US)

(73) Assignee: Fabric8Labs, Inc., San Diego, CA (US)

( * ) Notice: Subject to any disclaimer, the term of this patent is extended or adjusted under 35 U.S.C. 154(b) by 738 days.

This patent is subject to a terminal disclaimer.

(21) Appl. No.: 18/338,632

(22) Filed: Jun. 21, 2023

(65) Prior Publication Data

US 2024/0218546 A1 Jul. 4, 2024

Related U.S. Application Data

(60) Provisional application No. 63/436,504, filed on Dec. 31, 2022.

(51) Int. Cl.
*C25D 1/00* (2006.01)
*B33Y 10/00* (2015.01)
(Continued)

(52) U.S. Cl.
CPC .............. *C25D 1/003* (2013.01); *B33Y 10/00* (2014.12); *B33Y 30/00* (2014.12); *B33Y 50/02* (2014.12);
(Continued)

(58) Field of Classification Search
CPC . C25D 1/003; C25D 1/10; C25D 1/14; C25D 1/20; B33Y 10/00; B33Y 30/00;
(Continued)

(56) References Cited

U.S. PATENT DOCUMENTS

| | | | |
|---|---|---|---|
| 4,575,330 | A | 3/1986 | Hull |
| 4,678,282 | A | 7/1987 | Yaniv et al. |

(Continued)

FOREIGN PATENT DOCUMENTS

| | | | |
|---|---|---|---|
| CN | 104178782 | A | 12/2014 |
| CN | 204097583 | U | 1/2015 |

(Continued)

OTHER PUBLICATIONS

Fiaccabrino et al. ("Array of individually addressable microelectrodes," Sensors Actuators B 1994, 18-19, 675-677). (Year: 1994).*

(Continued)

*Primary Examiner* — Ciel P Contreras
*Assistant Examiner* — Kevin Sylvester
(74) *Attorney, Agent, or Firm* — Polygon IP, LLP

(57) ABSTRACT

Described herein are electrochemical-additive manufacturing (ECAM) systems comprising electrophoretically-deposited masks selectively covering a set of individually-addressable electrodes (pixels) in the electrode arrays (printheads). For example, an electrophoretically-deposited mask, comprising one or more patches, can be used to block the electric current through certain array portions thereby preventing electrolytic deposition on the corresponding portions of the deposition electrode during ECAM processes. In some examples, electrode array portions can be masked to cover damaged portions (e.g., stuck-on control circuits, electrically and/or ionically conductive passages in the electrode array) and/or to form special patterns of inactive array portions (that no longer need to be controlled using deposition control circuits). Such electrophoretically-deposited masks can be formed in an ECAM system or an external system. The mask forming can be a single-stage process or a multi-stage process. Furthermore, the mask position can be
(Continued)

self-defining, e.g., based on defect location and/or severity of defects.

13 Claims, 8 Drawing Sheets

(51) Int. Cl.

| | |
|---|---|
| ***B33Y 30/00*** | (2015.01) |
| ***B33Y 50/02*** | (2015.01) |
| ***B33Y 80/00*** | (2015.01) |
| ***C25D 1/10*** | (2006.01) |
| ***C25D 1/14*** | (2006.01) |
| ***C25D 1/20*** | (2006.01) |
| ***H05K 1/11*** | (2006.01) |
| ***H05K 3/40*** | (2006.01) |

(52) U.S. Cl.
CPC ................ *B33Y 80/00* (2014.12); *C25D 1/10* (2013.01); *C25D 1/14* (2013.01); *C25D 1/20* (2013.01); *H05K 1/11* (2013.01); *H05K 3/4007* (2013.01)

(58) Field of Classification Search
CPC ......... B33Y 80/00; B33Y 40/20; B33Y 50/02; H05K 1/11; H05K 3/4007
See application file for complete search history.

(56) References Cited

U.S. PATENT DOCUMENTS

| | | | | |
|---|---|---|---|---|
| 5,132,820 A | | 7/1992 | Someya et al. | |
| 5,403,460 A | | 4/1995 | Sala et al. | |
| 5,641,391 A | | 6/1997 | Hunter et al. | |
| 5,998,805 A | | 12/1999 | Shi et al. | |
| 6,017,432 A | * | 1/2000 | Boyd | C08G 18/3256 523/415 |
| 6,036,834 A | | 3/2000 | Clerc | |
| 7,839,831 B2 | | 11/2010 | Vrcelj et al. | |
| 8,168,540 B1 | | 5/2012 | Reid et al. | |
| 8,681,077 B2 | | 3/2014 | Kimura | |
| 9,777,385 B2 | | 10/2017 | Wirth et al. | |
| 10,465,307 B2 | | 11/2019 | Pain et al. | |
| 10,724,146 B1 | | 7/2020 | Pain et al. | |
| 10,914,000 B1 | | 2/2021 | Pain et al. | |
| 10,947,632 B1 | | 3/2021 | Pain et al. | |
| 11,232,956 B2 | | 1/2022 | Pain et al. | |
| 11,313,035 B2 | | 4/2022 | Pain et al. | |
| 11,313,036 B2 | | 4/2022 | Pain et al. | |
| 11,401,603 B2 | | 8/2022 | Pain et al. | |
| 12,486,589 B2 | * | 12/2025 | Matthews | B33Y 10/00 |
| 2001/0014409 A1 | | 8/2001 | Cohen | |
| 2003/0006133 A1 | | 1/2003 | Metzger | |
| 2004/0129573 A1 | | 7/2004 | Cohen | |
| 2005/0045252 A1 | | 3/2005 | Yamasaki et al. | |
| 2005/0176238 A1 | | 8/2005 | Cohen et al. | |
| 2005/0183959 A1 | | 8/2005 | Wilson et al. | |
| 2005/0202660 A1 | | 9/2005 | Cohen et al. | |
| 2005/0223543 A1 | | 10/2005 | Cohen et al. | |
| 2006/0283539 A1 | | 12/2006 | Slafer | |
| 2007/0068819 A1 | | 3/2007 | Singh et al. | |
| 2007/0089993 A1 | | 4/2007 | Schwartz et al. | |
| 2007/0221504 A1 | | 9/2007 | Luo | |
| 2010/0300886 A1 | | 12/2010 | Lin et al. | |
| 2011/0210005 A1 | | 9/2011 | Bossche et al. | |
| 2017/0145578 A1 | * | 5/2017 | Wirth | C25D 3/22 |
| 2017/0145584 A1 | | 5/2017 | Wirth et al. | |
| 2018/0319097 A1 | * | 11/2018 | Narayanan | B23K 9/042 |
| 2019/0160594 A1 | | 5/2019 | Flamm et al. | |
| 2021/0047744 A1 | | 2/2021 | Biton | |
| 2021/0090901 A1 | * | 3/2021 | Pain | B33Y 10/00 |
| 2022/0235481 A1 | * | 7/2022 | Mendonsa | C25D 17/12 |
| 2024/0218546 A1 | * | 7/2024 | Stone | B33Y 10/00 |

FOREIGN PATENT DOCUMENTS

| | | | | | |
|---|---|---|---|---|---|
| CN | 104593830 A | | 5/2015 | | |
| WO | 2017087884 A1 | | 5/2017 | | |
| WO | 2019150362 A1 | | 8/2019 | | |
| WO | 2021041265 A1 | | 3/2021 | | |
| WO | WO-2021102413 A1 | * | 5/2021 | | C25D 3/38 |

OTHER PUBLICATIONS

"Electrodeposition Photoresist: A New Technology of HDI PCB Manufacturing" Blog published Oct. 17, 2019. https://www.pcbway.com/blog/PCB_Manufacturing_Information/Electrodeposition_Photoresist_A_New_Technology_of_HDI_PCB_Manufacturing.html (Year: 2019).*

Frey et al., "Switch-matrix-based High-Density Microelectrode Array in CMOS Technology", IEEE Journal of Solid-State-Circuits, Feb. 2010, pp. 467-482, vol. 45, No. 2.

International Search Report and Written Opinion for PCT/US2020/047531 dated Sep. 29, 2020.

Nakamura et al., Incorporation of input function into displays using LTPS TFT technology, Journal of the SID, 2006, pp. 363-369, 14/4.

Stewart et al., "Polysilicon TFT Technology for Active Matrix OLEO Displays", IEEE Transactions on Electron Devices, May 2001, pp. 845-851, vol. 48, No. 5.

Supplementary International Search Report for PCT/US2020/047531 dated Nov. 22, 2021.

U.S. Appl. No. 17/535,437, filed Nov. 24, 2021.

U.S. Appl. No. 17/566,546, filed Dec. 30, 2021.

* cited by examiner

ELECTROPHORETICALLY-DEPOSITED MASKS ON ELECTRODE ARRAYS

CROSS-REFERENCE TO RELATED APPLICATIONS

This application claims the benefit under 35 U.S.C. § 119(e) of U.S. Provisional Patent Application No. 63/436,504, filed on 2022 Dec. 31, which is incorporated herein by reference in its entirety for all purposes.

BACKGROUND

Additive manufacturing, also known as 3-dimensional (3D) printing, is often used to produce complex parts using a layer-by-layer deposition process on substrates. Additive manufacturing can utilize a variety of processes in which various materials (e.g., plastics, liquids, and/or powders) are deposited, joined, and/or solidified. Some examples of techniques used for additive manufacturing include vat photopolymerization, material jetting, binder jetting, powder bed fusion (e.g., using selective laser melting or electron beam melting), material extrusion, directed energy deposition, and sheet lamination. However, metal additive manufacturing has been limited due to the high cost associated with selective laser melting and electron beam melting systems. Furthermore, thermal fusing produces parts with rough surface finishes because the unmelted metal powder is often sintered to the outer edges of the finished product.

SUMMARY

Described herein are electrochemical-additive manufacturing (ECAM) systems comprising electrophoretically-deposited masks selectively covering a set of individually-addressable electrodes (pixels) in the electrode arrays (printheads). For example, an electrophoretically-deposited mask, comprising one or more patches, can be used to block the electric current through certain array portions thereby preventing electrolytic deposition on the corresponding portions of the deposition electrode during ECAM processes. In some examples, electrode array portions can be masked to cover damaged portions (e.g., stuck-on control circuits, electrically and/or ionically conductive passages in the electrode array) and/or to form special patterns of inactive array portions (that do not need to be controlled using deposition control circuits). Such electrophoretically-deposited masks can be formed in an ECAM system or an external system. The mask forming can be a single-stage process or a multi-stage process. Furthermore, the mask position can be self-defining, e.g., based on defect location and/or severity of defects.

In some examples, an electrochemical-additive manufacturing method is provided. The method uses an electrochemical-additive manufacturing system comprising a deposition power supply, an electrode array comprising individually-addressable electrodes and deposition control circuits, and an electrolytic-deposit-receiving electrode. The method comprises positioning an electrophoretic-deposition-driving electrode and the electrode array into an electrophoretic suspension comprising solid charged structures such that the individually-addressable electrodes are in contact with the electrophoretic suspension. The method comprises applying a first voltage between the electrophoretic-deposition-driving electrode and a first electrode set of the individually-addressable electrodes thereby driving the solid charged structures to the first electrode set and forming an electrophoretically-deposited mask from the solid charged structures onto the first electrode set thereby creating a masked portion of the electrode array (by covering the first electrode set with the electrophoretically-deposited mask). The method comprises providing an electrolyte solution between the electrode array, comprising the electrophoretically-deposited mask on the first electrode set, and the electrolytic-deposit-receiving electrode, wherein the electrolyte solution comprises cations. The method comprises applying a second voltage between the electrolytic-deposit-receiving electrode and a second electrode set of the individually-addressable electrodes. The electric current flows through the second electrode set, but not through the first electrode set, covered with the electrophoretically-deposited mask. The cations flow to and reduce on a second portion of the electrolytic-deposit-receiving electrode aligned with the second electrode set, but not a first portion of the electrolytic-deposit-receiving electrode aligned with the first electrode set, thereby forming an electrolytic deposit onto the second portion of the electrolytic-deposit-receiving electrode.

In some examples, applying the second voltage between the electrolytic-deposit-receiving electrode and the second electrode set further comprises applying the second voltage between the electrolytic-deposit-receiving electrode and at least some electrodes in the first electrode set covered with the electrophoretically-deposited mask.

In some examples, the electrophoretic-deposition-driving electrode and the electrolytic-deposit-receiving electrode are different such that the electrophoretically-deposited mask is formed onto the first electrode set while the electrode array is removed from the electrochemical-additive manufacturing system. For example, the electrophoretic-deposition-driving electrode is a metal mesh extending proximate to the electrode array.

In some examples, applying the first voltage between the electrophoretic-deposition-driving electrode and the first electrode set of the individually-addressable electrodes comprises: (a) applying a third voltage to the first electrode set that is at a positive level above an earth ground, and (b) applying a fourth voltage to the electrophoretic-deposition-driving electrode that is at a positive level above earth ground that is greater than the third voltage by an amount equal to the first voltage.

Alternatively, the electrolytic-deposit-receiving electrode of the electrochemical-additive manufacturing system is operable as the electrophoretic-deposition-driving electrode while forming the electrophoretically-deposited mask onto the first electrode set such that the electrophoretic suspension is provided to the electrochemical-additive manufacturing system.

In some examples, each of the deposition control circuits is configured to control a flow of current through a corresponding one of the individually-addressable electrodes. While applying the first voltage between the electrophoretic-deposition-driving electrode and the first electrode set, all of the deposition control circuits connected to the first electrode set are instructed to turn on thereby allowing for a current to flow through the first electrode set. In some examples, the electrochemical-additive manufacturing method further comprises selecting the first electrode set based on a desired pattern for the electrode array. For example, the desired pattern for the electrode array is selected based on one or more defects of the electrode array. In some examples, selecting the first electrode set comprises testing the electrode array to determine the one or more defects of the electrode array.

In some examples, each of the deposition control circuits is configured to control the flow of current through a corresponding one of the individually-addressable electrodes. While applying the first voltage between the electrophoretic-deposition-driving electrode and the first electrode set, all of the deposition control circuits of the electrode array are instructed to turn off. The first electrode set is self-selected based on defects in a set of the deposition control circuits connected to the first electrode set.

In some examples, the electrochemical-additive manufacturing method further comprises removing the electrophoretically-deposited mask from the first electrode set.

In some examples, the electrolytic deposit comprises at least one of copper, nickel, tungsten, gold, silver, cobalt, chrome, iron, or tin. The the electrophoretically-deposited mask comprises at least one of ceramic, polymer, or glass.

In some examples, the first voltage is greater than the second voltage.

In some examples, the electrolytic solution has a lower viscosity than the electrophoretic suspension.

In some examples, the electrophoretic suspension further comprises a binder.

Also provided is an electrochemical-additive manufacturing system. In some examples, the electrochemical-additive manufacturing system comprises a deposition power supply, an electrode array comprising individually-addressable electrodes and deposition control circuits. The deposition control circuits are connected to the deposition power supply. Each of the deposition control circuits is configured to controllably connect a corresponding one of the individually-addressable electrodes to the deposition power supply. The individually-addressable electrodes comprise a first electrode set and a second electrode set. The first electrode set is covered by an electrophoretically-deposited mask comprising an insulating material. The second electrode set is exposed. The electrochemical-additive manufacturing system also comprises an electrolytic-deposit-receiving electrode connected to the deposition power supply and controllably positioned relative to the electrode array.

In some examples, the first electrode set is selected based on a desired pattern for the electrode array. For example, the desired pattern for the electrode array is selected based on one or more defects of the electrode array.

In some examples, each electrode in the first electrode set is connected to a malfunctioning deposition control circuit. In some examples, the first electrode set surrounds an electrode array defect.

DETAILED DESCRIPTION

Figure 1A:
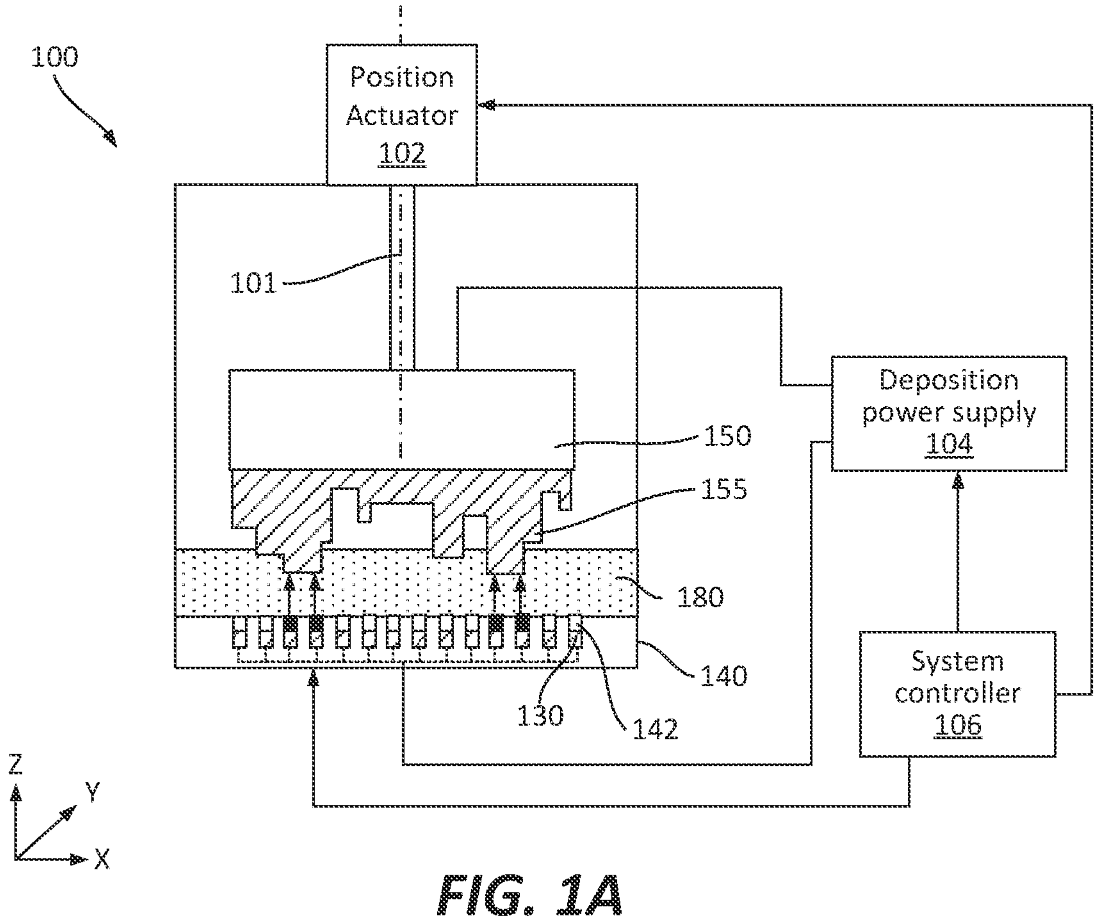
FIG. 1A is a schematic illustration of an ECAM system for the electrolytic deposition of materials on an electrolytic-deposit-receiving electrode using individually-addressable electrodes, in accordance with some examples.

In the following description, numerous specific details are outlined to provide a thorough understanding of the presented concepts. The presented concepts may be practiced without some or all of these specific details. In other instances, well-known process operations have not been described in detail to not unnecessarily obscure the described concepts. While some concepts will be described in conjunction with the specific embodiments, it will be understood that these embodiments are not intended to be limiting.

INTRODUCTION

ECAM systems use electrolytic solutions/electrolytes to form parts having various shares, compositions, and other characteristics. An ECAM system comprises two electrodes, one of which is arranged into an electrode array to provide more granular control over deposition conditions. Specifically, the electrode array is formed by individually-addressable electrodes, which can be arranged as a two-dimensional (2D) grid and which can be also referred to as electrode pixels or pixelated electrodes. When these individually-addressable electrodes are used as positive electrodes for receiving electrons from the electrolyte, these electrodes can be referred to as pixelated anodes. The electrode array may be also referred to as a printhead, providing a reference to 3D printing aspects of ECAM systems. Furthermore, display terminology can be used to refer to individually-addressable electrodes as "pixels". An instantaneous activation pattern produced by the array (by controllably activating a subset of pixels) may be referred to as an "image". Another electrode of an ECAM system can be referred to as a deposition electrode or, more specifically, an electrolytic-deposit-receiving electrode. This electrode is configured to receive electrolytically deposited material during system operation.

The operation of individually-addressable electrodes can be controlled using deposition control circuits, e.g., thin-film transistors, in which case, the array can be referred to as a thin-film transistor (TFT) array or a TFT micro-electrode array. These individually-addressable electrodes and corresponding deposition control circuits can be arranged in various patterns, e.g., 2-D rectangular, 2-D hexagonal, and other like patterns. Furthermore, these individually-addressable electrodes may be of uniform or non-uniform size, shape, thickness, composition, and other characteristics.

Specifically, the current density distribution is a critical parameter of the ECAM process. The current density distribution is influenced by the electrolyte conductivity, electrode shapes/positions relative to each other, electrode surface properties (e.g., the presence and properties of surface-active molecules), and potentials applied (which is one of the distinguishing features of the ECAM systems), among other factors. One advantage of using electrode arrays is controlling the current density distribution at each individually-addressable electrode. When an electrolytic-deposit-receiving electrode is positioned sufficiently close to an electrode array, this current density distribution at each individually-addressable electrode is translated into the corresponding current density distribution on the portions of the deposition electrode aligned with the corresponding individually-addressable electrodes. This corresponding current density distribution can be used for controlling plating rates, grain structures, grain sizes, and deposits' compositions among other characteristics. Overall, this current density control can be used to fabricate 3D parts ("prints") by successive controlled deposition of layers based on the desired properties of the product.

The electrode array and the electrolytic-deposit-receiving electrode are often positioned close together, e.g., less than 100 micrometers from each other, forming a gap. This arrangement helps to control the selective deposition aspects provided by each individually-addressable electrode. Specifically, each individually-addressable electrode is aligned with a specific portion of the deposition electrode surface or, even more specifically, with a specific portion of the deposited material surface. For purposes of this disclosure, the terms "deposited material" and "deposition electrode" are often used interchangeably since the deposition is performed on the deposited material surface using the electric current passing through both the deposition electrode and the deposited material. The deposited material effectively becomes part of the deposition electrode/cathode during the deposition operation. It should be noted that controlling the operation of this individually-addressable electrode effectively controls the deposition on the corresponding surface portion, aligned with the individually-addressable electrode.

The selective control of the deposition control circuits determines which ones of all individually-addressable electrodes allow passing the electric current during various ECAM processes. However, some deposition control circuits can malfunction, e.g., fail to disconnect the corresponding individually-addressable electrodes from the power supply thereby causing the material deposition in undesirable locations on the deposition electrode. In other words, these deposition control circuits are stuck in their "on" position ("stuck on") and fail to block the current through the corresponding individually-addressable electrodes when this current is not desirable. Another problem can occur as a result of cracks and other mechanical defects in the electrode arrays when these defects provide electronic and/or ionic pathways through the defects without adjacent deposition control circuits not allowing any current through the corresponding individually-addressable electrodes. In other words, the electronic and/or ionic pathways provide alternative uncontrollable current flows. Various other types of issues with ECAM systems are within the scope.

Described herein are ECAM systems comprising electrophoretically-deposited masks selectively covering some of the individually-addressable electrodes in the electrode arrays. Also described are methods of forming such electrophoretically-deposited masks on electrode arrays. For example, one or more electrophoretically-deposited masks can be used to block the electric current through certain portions of the electrode array thereby preventing electrolytic deposition of the corresponding portions of the deposition electrode during the ECAM process. Electrode array portions can be masked to cover damaged portions (e.g., stuck deposition control circuits, electrically and/or ionically conductive passages in electrode array) and/or to form special patterns of not-activatable portions of the electrode array. Electrophoretically-deposited masks can be formed in an ECAM system or in an external system, e.g., specially designed to form such masks. This mask forming can be a single-stage process or a multi-stage process. For example, the first stage may involve detecting "current leaking" defects in an electrode array. Specifically, the mask position can be self-defining, e.g., based on defect location and/or severity of defects (e.g., the electric conductivity of the defects). In other words, the mask is inherently formed at the location of "current leaking" defects. In the second stage, which is optional, the footprint of the mask is extended by purposely activating individually-addressable electrodes adjacent to the original mask footprint.

Unlike electrolytic deposition (ELD), which relies on the current flow and the reduction of cations provide in an electrolytic solution, electrophoretic deposition (EPD) uses an electric field to cause charged particles to be deposited from a liquid colloidal suspension/electrophoretic suspension onto an oppositely charged conductive surface. Various types of charged particles are within the scope, such as polymers or, more specifically, polyvinyl alcohol, polyethylene glycol, polyethyleneimine, polyacrylamide, polyvinylpyrrolidone, siloxanes, olefins, and fluoropolymers. These charged particles can be used to create electrophoretically-deposited masks, on electrode arrays. These masks are electronically isolating and prevent the electric current from flowing through these masked portions of the electrode arrays during electrolytic deposition thereby preventing deposition on the deposition electrode portions, which face these masked portions. As noted above, various defects may be associated with uncontrolled current passage through the electrode array and spurious electrolytic deposition in the undesirable parts of the deposition electrode/electrolytic-deposit-receiving electrode. Such uncontrolled deposition may require extensive post-processing or may cause the deposition process (print) to fail entirely. In some situations, these electrode defects may saturate current measurements used to evaluate (map) the deposition progress (e.g., to determine the deposit locations relative to the electrode array). Repositioning the deposition areas (e.g., to avoid the "stuck-on" pixels) may not avoid these types of problems. Furthermore, the self-aligning nature of the EPD provides a way of determining these defects (that otherwise may be difficult to determine, e.g., using visual analysis).

It should be noted that the remaining/unmasked portions of electrode arrays can be used for electrolytic deposition. Specifically, an electrode array with an electrophoretically-deposited mask (which can include one or more portions, e.g., disjoined portions) can be submerged into an electrolytic solution with the electrical current selectively passed through the unmasked individually-addressable electrodes. In other words, only a portion of individually-addressable electrodes can be used in an ELD process, e.g., by moving the remaining/unmasked portions of the electrode array to portions of the electrolytic-deposit-receiving electrode that require deposits.

It should be noted that during an ELD process, positive metallic ions are reduced onto a build plate via charge transfer through a highly conductive electrolyte solution. In contrast, during an EPD process, solid charged structures provided in an electrophoretic suspension are deposited onto a build plate (e.g., onto specific portions of the surface of an electrode array in the case of an electrophoretically-deposited mask). An electrophoretic suspension has a low conductivity and comprises various organic solvents. In cathodic EPD, positively charged solid particles are deposited onto a surface that is negatively charged relative to a driving anode. In anodic EPD, negatively charged solid particles are deposited onto a surface that is negatively charged relative to a driving cathode.

ECAM System Examples

FIG. 1A is a schematic illustration of ECAM system 100 used for depositing or, more specifically, electroplating material 155, in accordance with some examples. ECAM system 100 may comprise position actuator 102, system controller 106, deposition power supply 104, electrode array 140, and electrolytic-deposit-receiving electrode 150. In some examples, electrolytic-deposit-receiving electrode 150 is connected to deposition power supply 104 and controllably supported relative to electrode array 104 (e.g., by position actuator 102). Electrode array 140 comprises deposition control circuits 130 and individually-addressable electrodes 142 such that each deposition control circuit 130 controls the current flow through a corresponding one of individually-addressable electrodes 142 (e.g., based on input from system controller 106). In some examples, electrode array 140 also comprises electrophoretically-deposited mask 170 as further described below with reference to FIGS. 4A-4E.

Position actuator 102 can be mechanically coupled to electrode array 140 and/or electrolytic-deposit-receiving electrode 150 and used to change the relative position of electrode array 140 and electrolytic-deposit-receiving electrode 150 (e.g., changing the gap between electrode array 140 and electrolytic-deposit-receiving electrode 150, linearly moving and/or rotating one or both electrode array 140 and electrolytic-deposit-receiving electrode 150 within a plane parallel to the electrode array 140). While FIG. 1A illustrates position actuator 102 being coupled to electrolytic-deposit-receiving electrode 150, other examples are also within the scope.

System controller 106 is used for controlling the operations of various components. For example, FIG. 1A illustrates system controller 106 being communicatively coupled with position actuator 102, deposition power supply 104, and deposition control circuits 130. For example, system controller 106 can instruct position actuator 102 to change the relative position of electrode array 140 and electrolytic-deposit-receiving electrode 150. In the same or other examples, system controller 106 can selectively instruct some deposition control circuits 130 to provide current through corresponding individually-addressable electrodes 142.

During the operation of ECAM system 100, system 100 also comprises electrolyte solution 180 comprising a source of cations (e.g., metal cations) that are reduced on electrolytic-deposit-receiving electrode 150 (operable as a cathode during this operation) and form material 155. More specifically, material 155 is deposited onto electrolytic-deposit-receiving electrode 150 from electrolyte solution 180 by flowing the electrical current between selected ones of individually-addressable electrodes 142 and electrolytic-deposit-receiving electrode 150. The selection of individually-addressable electrodes 142 (as well as the position of electrophoretically-deposited mask 170 on electrode array 140, see for example, FIG. 3A) determines the specific areas on electrolytic-deposit-receiving electrode 150 where this material 155 is deposited thereby allowing a very granular approach to the deposition. In some examples, further granularity is provided by controlling the current levels through each individually-addressable electrode 142. In other words, not only the current can be shut off through one or more individually-addressable electrodes 142 but different levels of current can flow through different individually-addressable electrodes 142.

Figure 1B:
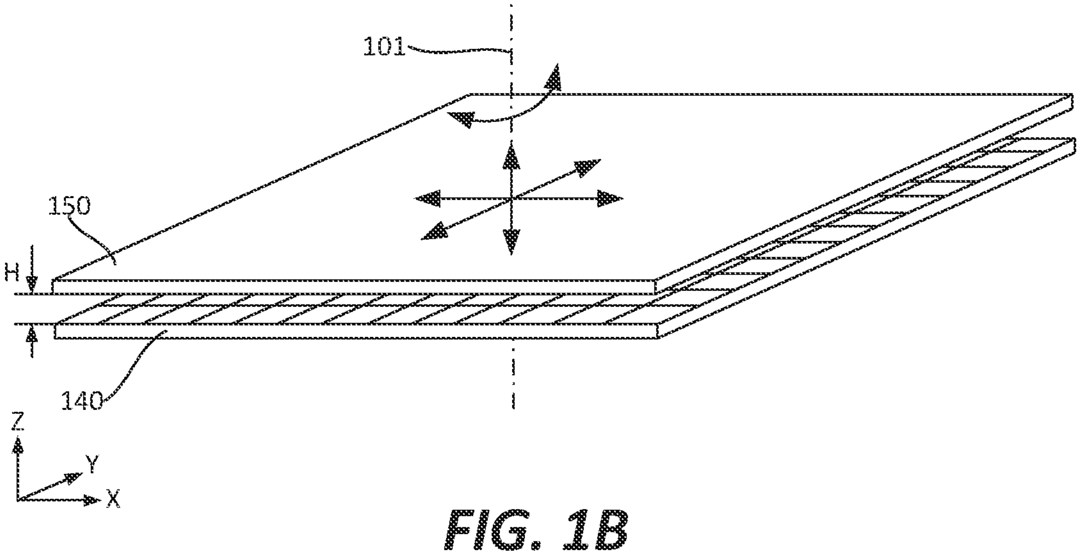
FIGS. 1B and 1C are schematic illustrations of an electrode array comprising individually-addressable electrodes (pixel electrodes), in accordance with some examples.

FIG. 1B is a perspective schematic view of electrode array 140 and electrolytic-deposit-receiving electrode 150, in accordance with some examples. This combination of electrode array 140 and electrolytic-deposit-receiving electrode 150 may be also referred to as an electrodeposition cell, which is a primary component of ECAM system 100. Electrolytic-deposit-receiving electrode 150 and electrode array 140 form a gap, which is filled (partially or fully) with an electrolyte solution during the operation. The height (H) of this gap is specifically controlled (e.g., between 5 micrometers and 200 micrometers) as the height influences the deposition conditions. For example, an excessive gap height can result in lower deposition rates and less control over the deposition locations. On the other hand, a gap height below the target value can cause excessive deposition rates and even shorts. It should be noted that the height gap can be different at different portions of electrolytic-deposit-receiving electrode 150 and electrode array 140. Furthermore, the average gap height can change between various deposition and electrolyte flow stages (e.g., using position actuator 102). For example, the average gap height can be increased to decrease the average current flow between electrolytic-deposit-receiving electrode 150 and electrode array 140 (and vice versa). Furthermore, the gap can be increased (while the deposition is suspended) to flow fresh electrolyte solution into the gap. Overall, electrolytic-deposit-receiving electrode 150 and electrode array 140 can be moved relative to each in various directions as indicated in FIG. 1B, e.g., along primary axis 101 and/or within the plane perpendicular to primary axis 101 (including the rotation about primary axis 101).

Figure 1C:
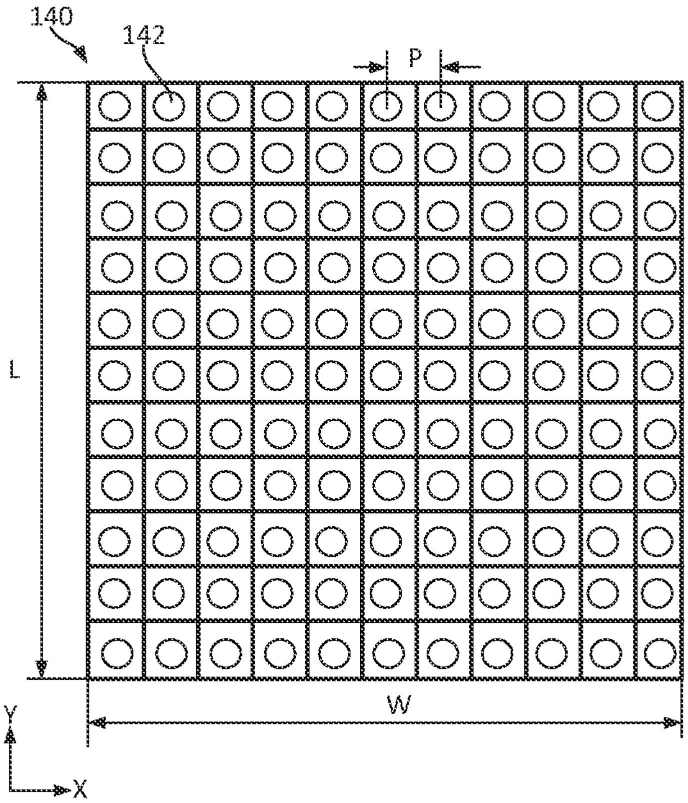

Referring to FIG. 1C, electrode array 140 comprises individually-addressable electrodes 142, which may be also referred to as grid regions, microelectrodes (or micro-anodes), and/or pixels. For clarity, electrophoretically-deposited mask 170 (see FIGS. 3A and 3B) is not shown in this view. More specifically, ECAM system 100 provides electrical control of each of individually-addressable electrodes 142 (using separate deposition control circuits 130). Specifically, each deposition control circuit 130 is connected to one of individually-addressable electrodes 142 and controls the application of voltage to and flow of the electric current through this individually-addressable electrode 142 independently through other individually-addressable electrodes 142. This individually-addressable feature allows the achievement of different deposition rates at different locations on electrolytic-deposit-receiving electrode 150. Individually-addressable electrodes 142 form a deposition grid, in which these portions may be offset relative to each other along the X-axis and Y-axis. The grid may be characterized by a grid X-axis resolution (corresponding to the number of grid regions along the X-axis), grid Y-axis resolution (corresponding to the number of grid regions along the Y-axis), grid X-axis pitch (corresponding to the length of each grid region along the X-axis), grid Y-axis pitch (corresponding to the length of a grid region along the Y-axis), overall grid pitch (corresponding to the minimum of the grid X-axis pitch and the grid Y-axis pitch), and grid region area. In some examples, one or both of the grid's X-axis resolution and the Y-axis resolution is between 50 and 500, such as between 75 and 250. In the same or other examples, one or both of the grid's X-axis pitch and the Y-axis pitch are 100 micrometers or less, 50 micrometers or less, or even 35 micrometers or less. Other example grids include triangular, hexagonal, or other patterns that partially or completely tessellate a surface. In some examples, individually-addressable electrodes 142 are formed from an insoluble conductive material, such as platinum group metals and their associated oxides, doped semiconducting materials, and carbon nanotubes. The shape of individually-addressable electrodes 142 can be round, rectangular, or other shapes. The size of Individually-addressable electrodes 142 (the pixel size) is slightly smaller (e.g., at least 10% smaller, at least 20% smaller) than the pitch thereby providing the space between Individually-addressable electrodes 142. In one example, the pitch is between 25 micrometers and 35 micrometers, while the pixel size can be between 15 micrometers and 20 micrometers.

Figure 2A:
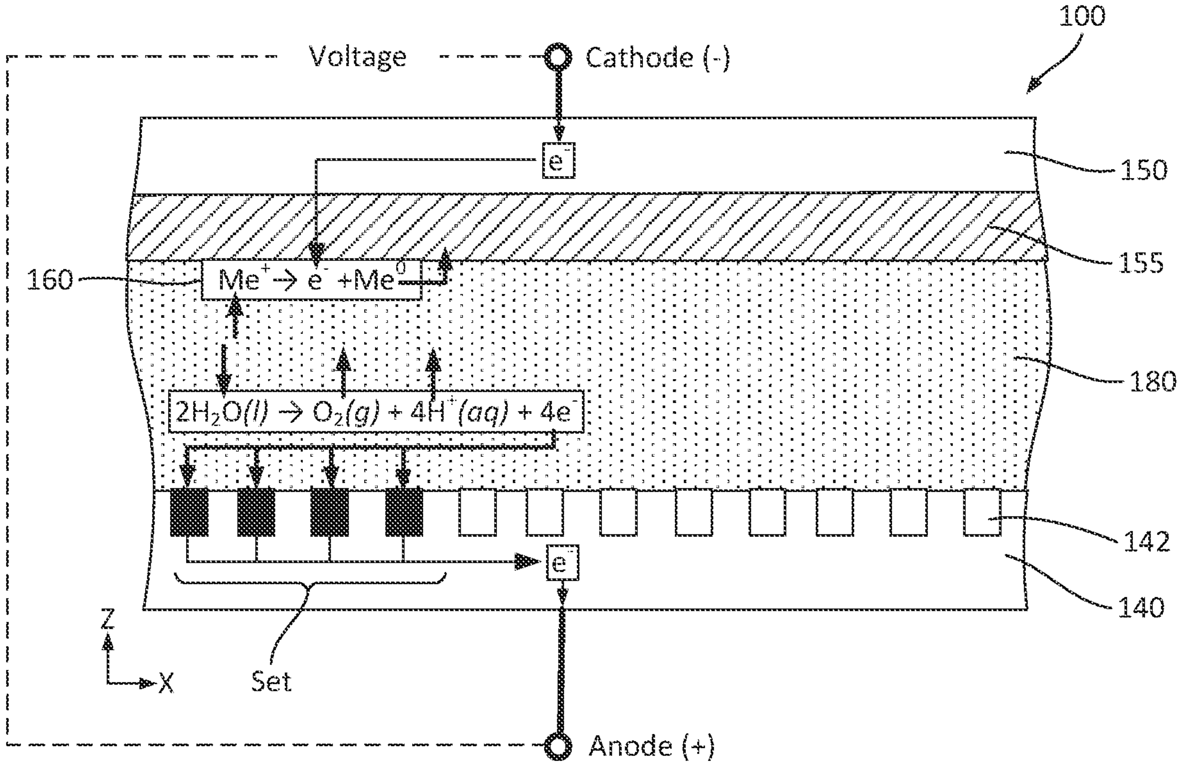
FIG. 2A is a schematic cross-sectional view of an ECAM system illustrating the electrolytic deposition of material from electrolyte solution on an electrolytic-deposit-receiving electrode, in accordance with some examples.
Figure 2B:
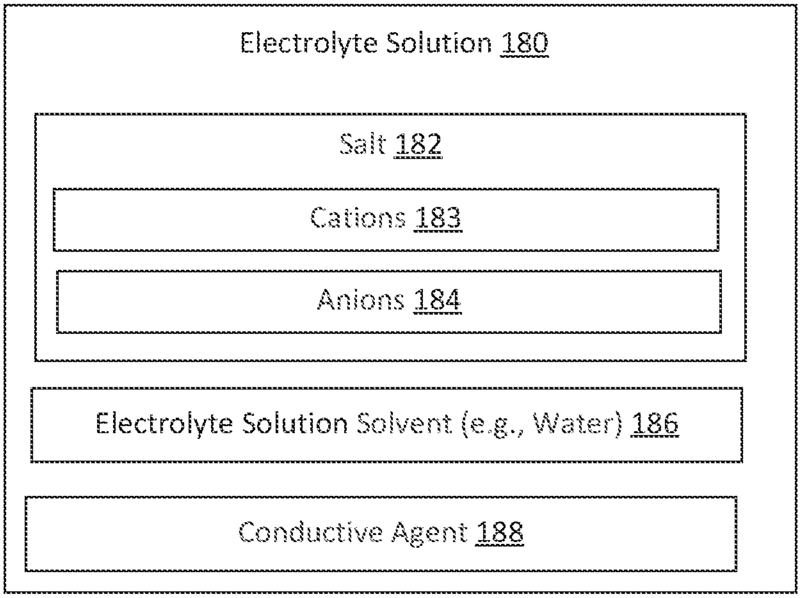
FIG. 2B is a block diagram illustrating various components of an electrolytic solution used for electrolytic deposition, in accordance with some examples.

FIG. 2A is a schematic expanded view of a portion of ECAM system 100 illustrating electrolyte solution 180 between electrode array 140 and electrolytic-deposit-receiving electrode 150, in accordance with some examples. FIG. 2B is a schematic block diagram illustrating different components of electrolyte solution 180. For example, electrolyte solution 180 may comprise salt 182, electrolyte solution solvent 186, and conductive agent 188. Salt comprises cations 183 and anions 184. Cations 183 can be in the form of metal ions, metal complexes, and the like. Some examples of cations 183 include metal cations (e.g., copper ions, nickel ions, tungsten ions, gold ions, silver ions, cobalt ions, chrome ions, iron ions, or tin ions), and other types of cations are within the scope. Some specific examples of salt 182 (feedstock ion sources) include but are not limited to copper sulfate, copper chloride, copper fluoroborate, copper pyrophosphate, nickel sulfate, nickel ammonium sulfate, nickel chloride, nickel fluoroborate, zinc sulfate, sodium thiocyanate, zinc chloride, ammonium chloride, sodium tungstate, cobalt chloride, cobalt sulfate, hydroxy acids, and aqua ammonia. In some examples, feedstock ion sources, or other sources of cations (e.g., salts) are referred to as material concentrates. Electrolyte solution solvent 186 can be water, which dissociates (2H2O(I)=>O2 (g)+4H+(aq.)+4e−) on electrode array 140 or, more specifically, on individually-addressable electrodes 142 that are activated during this operation. Specifically, the activated individually-addressable electrodes 142 are connected to deposition power supply 104 (by the corresponding deposition control circuits 130). In some examples, electrolyte solution 180 comprises catholyte conductive agent 188, such as an acid (e.g., sulfuric acid, acetic acid, hydrochloric acid, nitric acid, hydrofluoric acid, boric acid, citric acid, and phosphoric acid). In some examples, electrolyte solution 180 comprises one or more additives, such as a leveler, a suppressor, and an accelerator, particulates for co-deposition (e.g., nanoparticles and microparticles such that diamond particles, tungsten-carbide particles, chromium-carbide particles, and silicon-carbide particles).

In some examples, electrolyte solution 180 is provided in an electrolyte-carrying structure, e.g., sponge, porous film, mesh, and the like. The electrolyte-carrying structure can be advanced (e.g., can be rewound) between electrode array 140 and deposition electrode 150 as electrolyte solution 180 is consumed. In some examples, electrode array 140 and deposition electrode 150 are advanced toward each other to displace (squeeze) electrolyte solution 180 from the electrolyte-carrying structure.

Returning to the example shown in FIG. 2A, cations (e.g., metal cations are combined with electrons, which are supplied to electrolytic-deposit-receiving electrode 150 thereby forming material 155 (e.g., metal deposit—$Me^0$). As noted above, the charge balance within electrolyte solution 180 is maintained by protons generated at electrode array 140. It should be noted that only a set of individually-addressable electrodes 142 can be activated during this ECAM process resulting in electrolytic deposit 160 formed on a corresponding portion of electrolytic-deposit-receiving electrode 150. This corresponding portion is aligned with the activated set of individually-addressable electrodes 142 while the remaining portion of electrolytic-deposit-receiving electrode 150 remains free of electrolytic deposit 160. This selective deposition is a core ECAM feature provided by selective control of the current passing through individually-addressable electrodes 142.

Figure 2C:
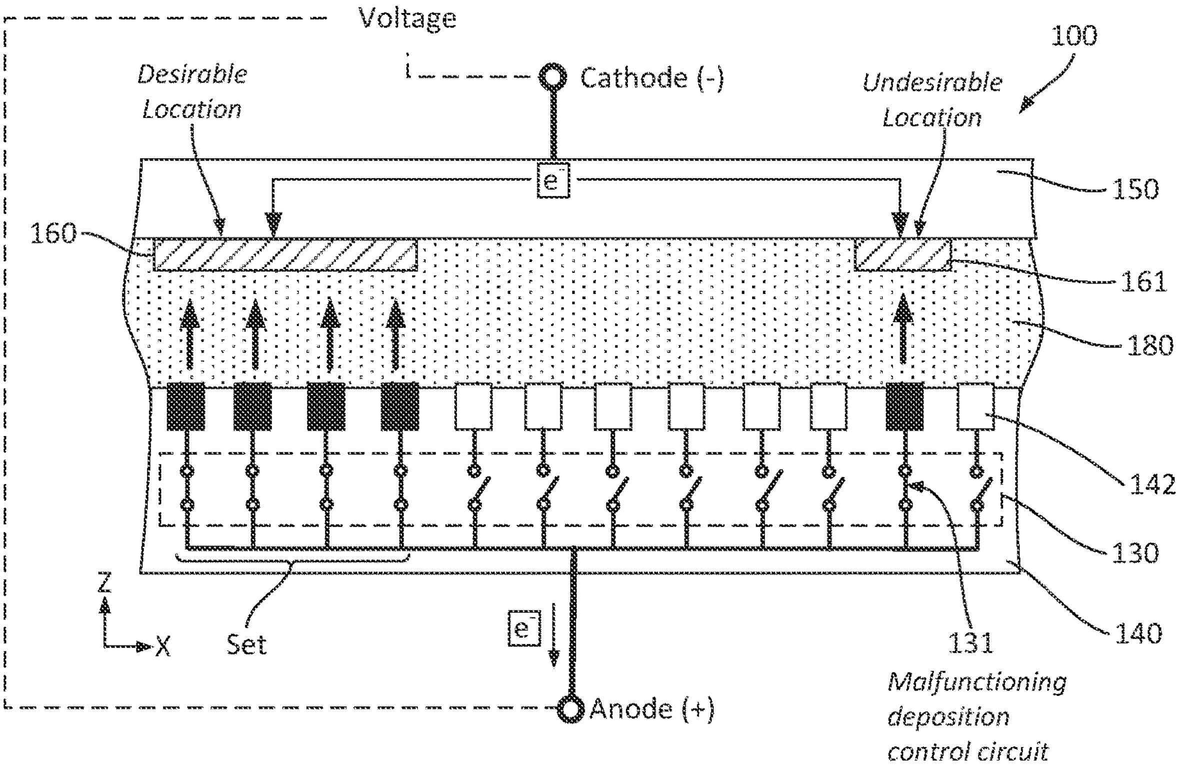
FIG. 2C is a schematic cross-sectional view of an ECAM system illustrating the electrolytic deposition in a desirable electrode location (driven by controllably-activated deposition control circuits) and also in an undesirable electrode location (driven by an uncontrollably-activated/stuck-on deposition control circuit), in accordance with some examples.

FIG. 2C is a schematic cross-sectional view of ECAM system 100 illustrating electrolytic deposition 160 in a desirable location and electrolytic deposition 161 in an undesirable location. Specifically, electrolytic deposition 160 in a desirable location is formed like the one described above with reference to FIG. 2A, i.e., driven by a controllably-activated set of individually-addressable electrodes 142. However, electrolytic deposit 161 in an undesirable location is driven by malfunctioning deposition control circuit 131 (e.g., uncontrollably activated/stuck-on deposition control circuit) allowing the electrical current to pass to the corresponding individually-addressable electrode 142.

Figure 2D:
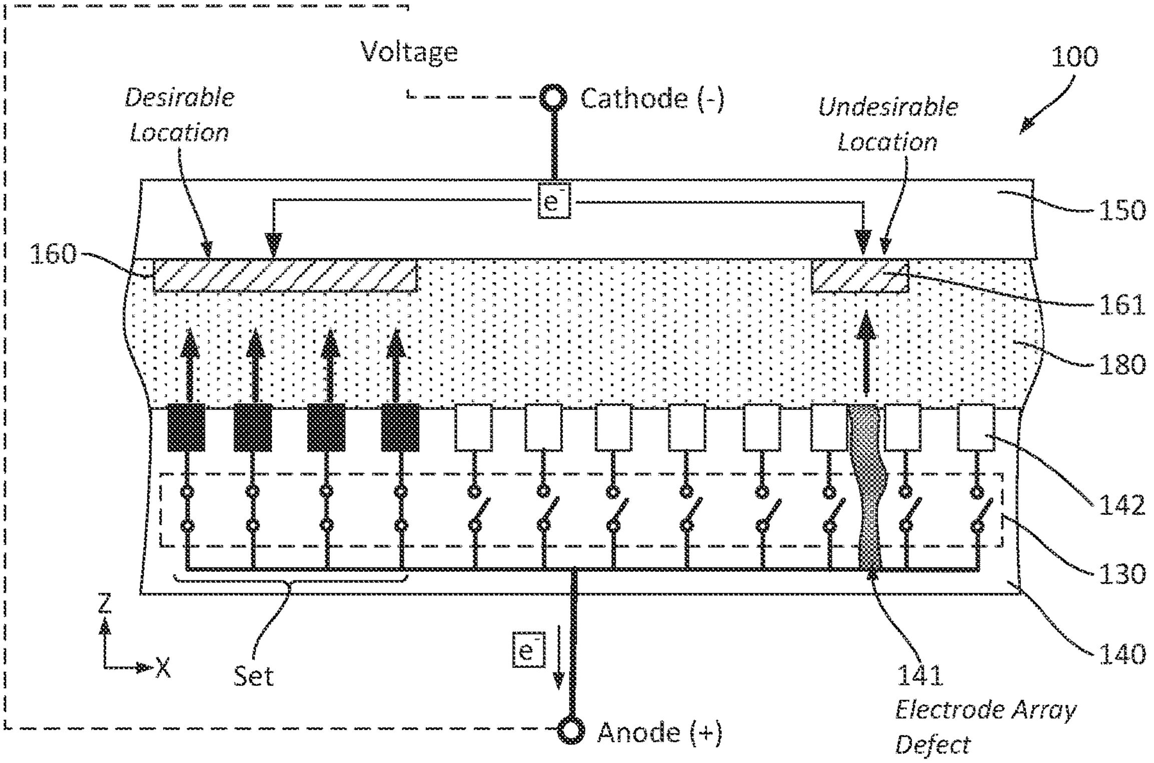
FIG. 2D is a schematic cross-sectional view of an ECAM system illustrating the electrolytic deposition in a desirable electrode location (driven by controllably-activated deposition control circuits) and also in an undesirable electrode location (driven by a defect in the electrode array), in accordance with some examples.

FIG. 2D is another example of electrolytic deposit 161 in an undesirable location. In this example, this undesirable deposit is caused by electrode array defect 141 in the electrode array which allows the current to pass to electrolyte solution 180. In this specific example, the current is not passing through any individually-addressable electrodes 142. Another example failure mode (not illustrated in the drawings) may involve a short (possibly due to fabrication defect) between deposition power supply 104 (e.g., the output of deposition power supply 104) and individually-addressable electrodes 142 (one or more of the pixels).

Examples of Electrophoretically-Deposited Masks and Methods of Forming Thereof

Electrode array 140 (which may be referred to as a printhead or, more specifically, an ECAM printhead) may be selectively activated to individually control pixels (individually-addressable electrodes 142) to various states such as connection to deposition power supply 104. These states may be a positive potential (relative to the deposition electrode), a negative potential, time-varying, constant, alternately open circuit (high-impedance), and the like. Thus, in some examples, the activation of individually-addressable electrodes 142 may be used to control the electrophoretic deposition onto electrode array 140 or, more specifically, onto one or more subsets of individually-addressable electrodes 142.

As further described below, electrode array 140 can be controlled such that all of individually-addressable electrodes 142 are commanded to an open circuit (off) state. Any individually-addressable electrodes 142 in a stuck-on state will then be connected to deposition power supply 104, while all others will be disconnected. In that state, either cathodic or anodic EPD deposits can be formed on the stuck-on individually-addressable electrodes 142. In some examples, cathodic EPD may be performed by introducing an EPD-driving electrode with a higher voltage potential than the printhead electrode power supply. For example, if the ELD-electrode power supply is +10V relative to earth ground and a +20V potential difference is needed for EPD, then a +30V power supply (relative to earth ground) may be used. In practice, the EPD power supply may simply be referenced to the printhead electrode driving power supply. For anodic EPD, the EPD driving electrode may be connected to a power supply that is more negative than the printhead electrodes.

As further described below, an example deposition control circuit may have a first switching element (deposition control circuit 130) controlled by a corresponding row trace (coupled to a row driver) and a second switching element (deposition control circuit 130) controlled by a column trace (coupled to a column driver). In some examples, the second switching element can be controlled when the first switching element is active. Specifically, the second switching element may control the amount of current flowing to each individually-addressable electrode from bus bars. The switching elements may be, for example, thin film transistors, such as those made from low-temperature polycrystalline silicon or indium gallium zinc oxide. Other examples are within the scope.

Figure 3A:
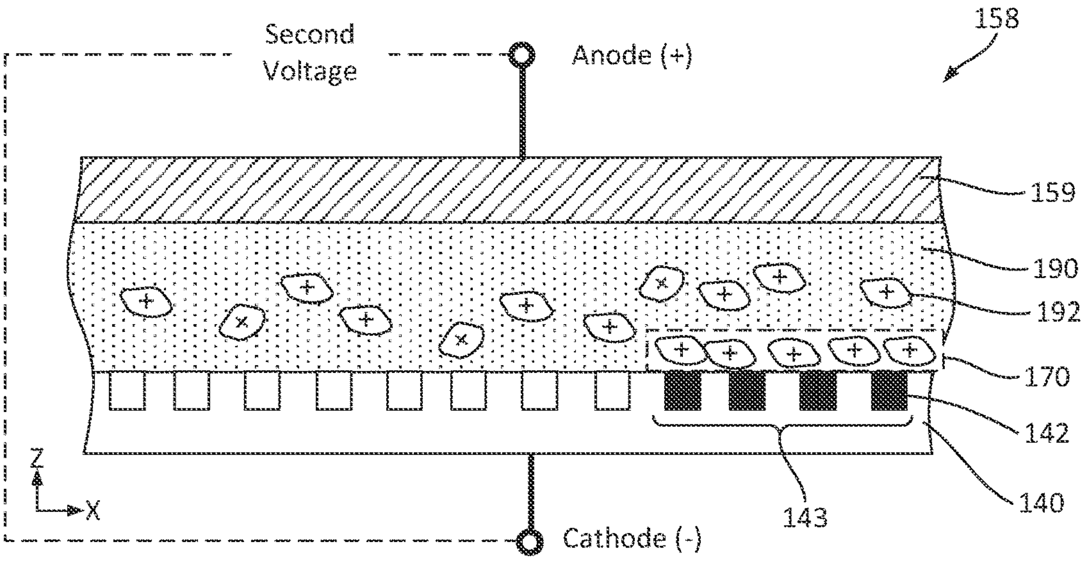
FIG. 3A is a schematic cross-sectional view of a system illustrating the electrophoretic deposition or, more specifically, the cathodic electrophoretic deposition of a mask on a portion of the electrode array, in accordance with some examples.
Figure 3B:
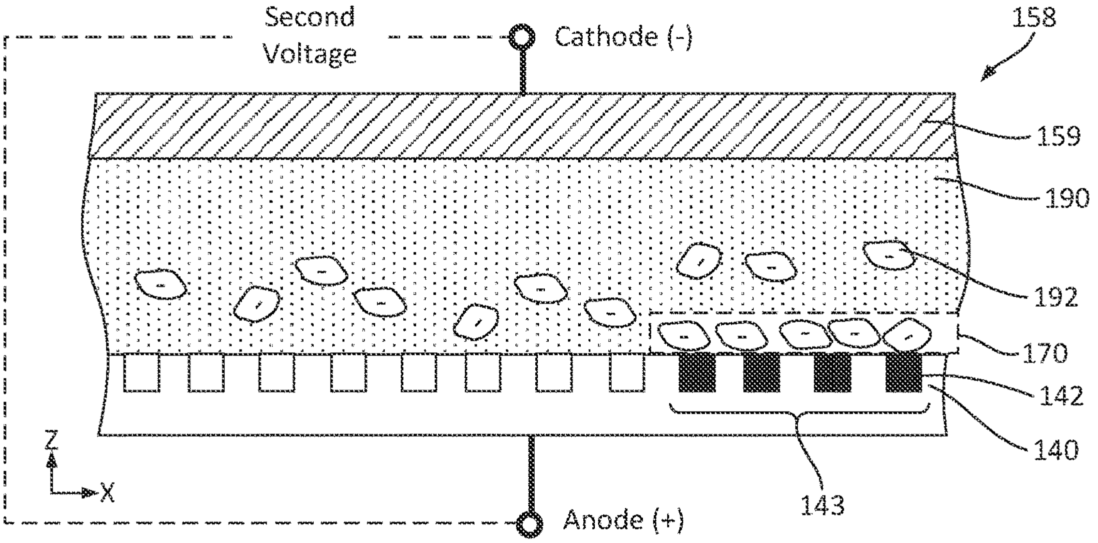
FIG. 3B is a schematic cross-sectional view of a system illustrating the electrophoretic deposition or, more specifically, the anodic electrophoretic deposition of a mask on a portion of the electrode array, in accordance with some examples.

FIG. 3A is a schematic cross-sectional view of system 158 illustrating the electrophoretic deposition of electrophoretically-deposited mask 170 onto electrode array 140, in accordance with some examples. More specifically, the example illustrated in FIG. 3A is cathodic electrophoretic deposition that uses solid charged structures 192 that are positively charged. In this example, electrode array 140 is operable as a cathode (attracting these positively charged particles to form electrophoretically-deposited mask 170). FIG. 3B is a schematic cross-sectional view of system 158 illustrating anodic electrophoretic deposition that uses negatively-charged solid charged structures 192. In this example, electrode array 140 is operable as an anode (attracting these negatively charged particles to form electrophoretically-deposited mask 170). In either case, when a voltage/electric field is applied between electrode array 140 and electrode 159, solid charged structures 192 electrophoretically migrate towards first electrode set 143 in electrode array 140 (that has an opposite charge) and deposit over first electrode set 143 by one of the following mechanisms (1) charge destruction causing the solubility decrease, (2) concentration coagulation, and (3) salting out. For example, during an anodic deposition, a fully protonated acid carries no charge (by the way of charge destruction) and, as a result, is less soluble in electrophoretic suspension solvent 196 (e.g., water) causing its precipitation on first electrode set 143. In another example, during a cathodic deposition, a protonated base of a polymer (used as solid charged structures 192) can react with hydroxyl ions (e.g., formed by electrolysis of water used as electrophoretic suspension solvent 196) forming a neutral charged base such that the uncharged polymer is less soluble causing the precipitation. In yet another example, onium salts can be used in solid charged structures 192 that are cathodically deposited by concentration coagulation and salting out. Specifically, colloidal particles are charge-squeezed on the deposition surface forming larger micelles that are less stable causing their precipitation.

Figure 3C:
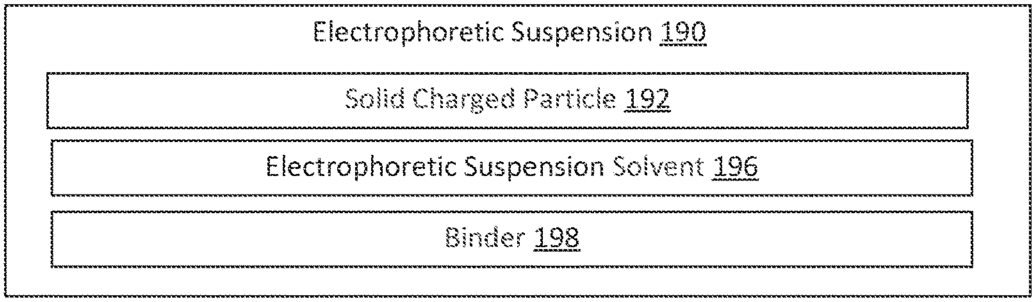
FIG. 3C is a block diagram illustrating various components of an electrophoretic suspension, in accordance with some examples.

FIG. 3C is a block diagram illustrating various components of electrophoretic suspension 190, in accordance with some examples. In addition to solid charged structures 192, electrophoretic suspension 190 may comprise electrophoretic suspension solvent 196 and binder 198, e.g., comprising ceramics and/or metals in some examples.

Some examples of solid charged structures 192 include but are not limited to polymers or, more specifically, polyelectrolytes (i.e., polymers with ionizable groups). In electrophoretic suspension 190, the interaction between the ionizable groups can lead to the formation of complexes, which can influence viscosity, surface tension, and stability as well as EPD properties. The choice of acid and base used to form ionizable groups determines the charge. For example, if an acid (e.g., hydrochloric acid) is reacted with a polymer containing amine groups, the resulting solid charged structures 192 will carry a positive charge. Conversely, if a base (e.g., sodium hydroxide) is reacted with a polymer containing carboxylic acid groups, the resulting particles will carry a negative charge. Some examples of suitable polymers include but are not limited to polyvinyl alcohol, polyethylene glycol, polyethyleneimine, polyacrylamide, polyvinylpyrrolidone, siloxanes, olefins, and fluoropolymers) and polyurethane.

Some examples of electrophoretic suspension solvent 196 include but are not limited to methanol, ethanol, n-propanol, iso-propanol, n-butanol, ethylene glycol, acetylacetone, cyclohexane, dichloromethane, methyl ethyl ketone (MEK), toluene, and acetone. In some examples, water can be used as electrophoretic suspension solvent 196 in electrophoretic suspension 190. However, water may limit using high direct current (DC) voltages (e.g., above 4V) during EPD due to water electrolysis, although some success may be possible at higher voltages using AC and/or pulsed DC. At the same time, low voltages may limit the thickness of electrophoretically-deposited mask 170 and reduce the EPD rate. Non-aqueous solvents may allow the application of higher voltages. Furthermore, electrophoretic suspension solvent 196 may have a specific dielectric constant (e.g., between 10 and 30) to provide sufficient dissociative power while providing sufficient electrophoretic mobility (especially with high concentrations of solid charged structures 192).

Some examples of binder 198 include but are not limited to poly(diallyldimethylammonium chloride) (PDDA) and polyurethane (e.g., a binder in LEGOR KLIAR-BLU). In some examples, binder 198 is removed from the final composition of electrophoretically-deposited mask 170, e.g., through a process such as burnout.

These materials are mixed into electrophoretic suspension 190, which has different composition and properties than electrolyte solution 180 described above. Specifically, electrolyte solution 180 is used for ELD that involves cations (provided in electrolyte solution 180) reduction on electrolytic-deposit-receiving electrode 150. Electrolyte solution 180 needs to be highly conductive and typically uses water as a solvent. Electrophoretic suspension 190 is used for EPD that involves transferring/driving solid charged structures 192 (suspended in electrophoretic suspension solvent 196) to portions of electrode array 140. Unlike ELD, EPD is not a current-driven process (negligible currents can result from charge carried by solid charged structures 192). Electrophoretic suspension 190 generally needs to have low conductivity and typically uses organic materials as a solvent although water is still within the scope.

In some examples, the conductivity of electrophoretic suspension 190 is significantly lower than that of electrolyte solution 180, e.g., at least 10 times lower, at least 100 times lower, or even 1000 times lower. However, when electrophoretic suspension 190 is too conductive, the motion of solid charged structures 192 is very low. On the other hand, when electrophoretic suspension 190 is too resistive, the particles charge electronically resulting in a lack of suspension stability.

In some examples, electrophoretic suspension 190 is provided in a suspension-carrying structure, e.g., sponge, porous film, mesh, and the like. The suspension-carrying structure can be advanced (e.g., can be rewound) between electrode array 140 and deposition electrode 150 as electrophoretic suspension 190 is consumed. In some examples, electrode array 140 and deposition electrode 150 are advanced toward each other to displace (squeeze) electrophoretic suspension 190 from the suspension-carrying structure.

Figure 4A:
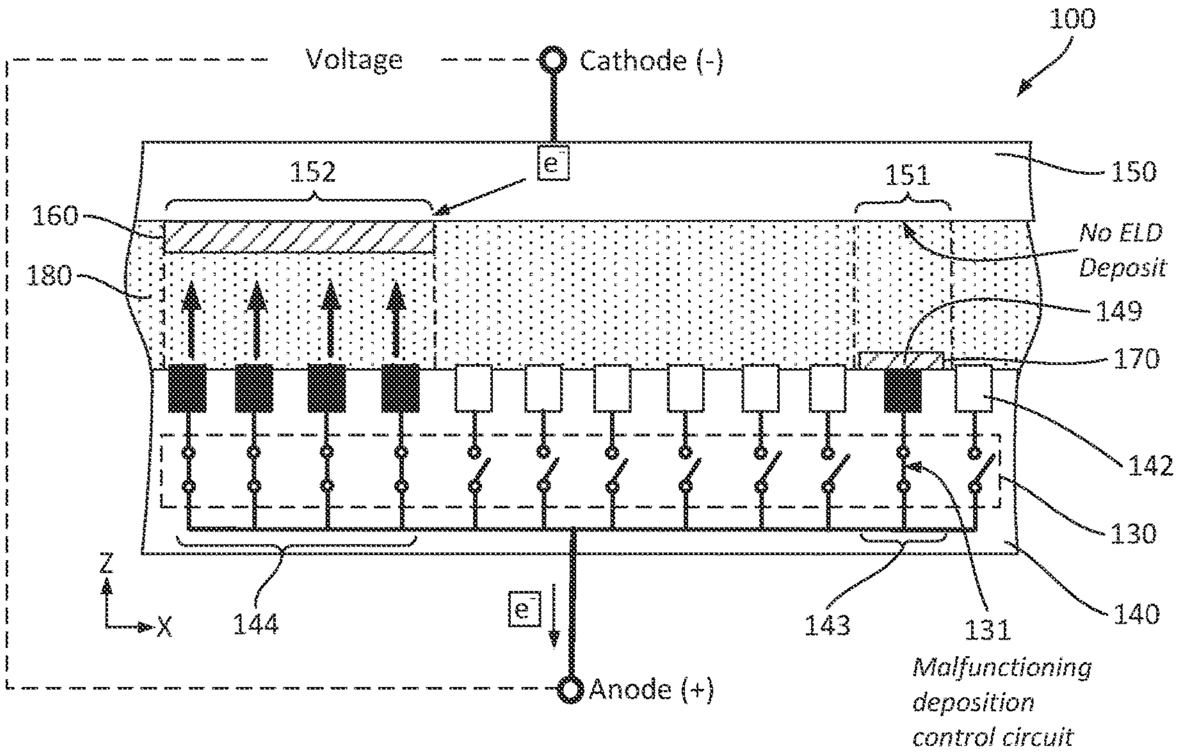
FIG. 4A is a schematic cross-sectional view of an ECAM system illustrating the electrolytic deposition of material in a desirable electrode location (driven by controllably-activated deposition control circuits) while the defect in the electrode array is blocked by the electrophoretically-deposited mask, in accordance with some examples.

Referring to FIG. 4A, ECAM system 100 or a separate system can be used for depositing an electrophoretically-deposited mask 170. In other words, system 158 can be ECAM system 100 (in which case electrophoretic-deposition-driving electrode 159 is the same as electrolytic-deposit-receiving electrode 150). For example, electrolyte solution 180 can be flushed out of ECAM system 100 and replaced with electrophoretic suspension 190. In this example, deposition power supply 104 can be used to apply a first voltage. Alternatively, system 158 (used to form electrophoretically-deposited mask 170) is a different system. In this example, electrode array 140 is removed from ECAM system 100 and is used in system 158. It should be noted that many processing conditions, e.g., applied voltages, are quite different for ELD and EPD. Furthermore, the characteristics of electrolyte solution 180 and electrophoretic suspension 190 can be quite different and require different components to flow and otherwise manage these liquids.

The current blocking function of electrophoretically-deposited mask 170 will now be described with reference to FIG. 4A. Specifically, FIG. 4A is a schematic cross-sectional view of ECAM system 100 comprising electrophoretically-deposited mask 170 positioned over first electrode set 143. In some examples, the first electrode set 143 corresponds to the defect in the electrode array 140 (e.g., corresponding to malfunctioning deposition control circuits 131). Alternatively, first electrode set 143 can represent an area for patterning. While the voltage is applied to first electrode set 143 (e.g., as a part of this defect), there is no current through first electrode set 143 and, as a result, there is no deposition to first portion 151 of electrolytic-deposit-receiving electrode 150. At the same time, the voltage is also applied to the second electrode set 144, which is exposed to electrolyte solution 180. Second electrode set 144 is aligned with second portion 152 of electrolytic-deposit-receiving electrode 150 where electrolytic deposit 160 is formed, e.g., as described above with reference to FIG. 2A. In other words, the electrolytic deposition is performed in a desirable electrode location (second portion 152) and is not in the undesirable location (first portion 151).

Figure 4B:
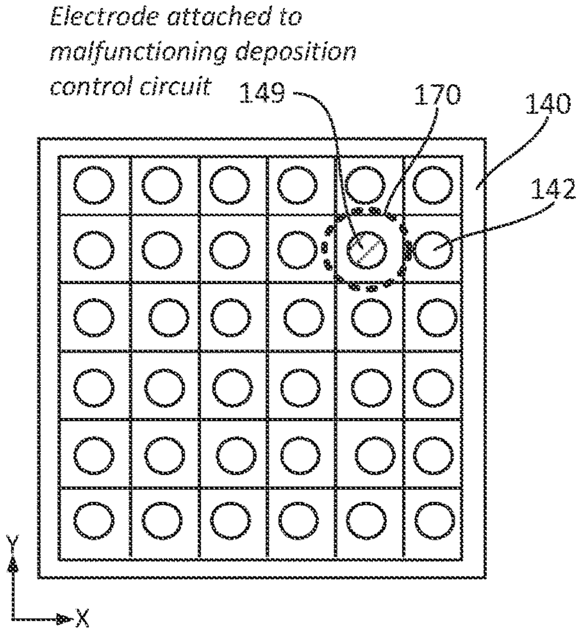
FIGS. 4B-4E are top schematic views of different examples of the electrophoretically-deposited mask selectively covering the individually-addressable electrodes of the electrode array, in accordance with some examples.
Figure 4C:
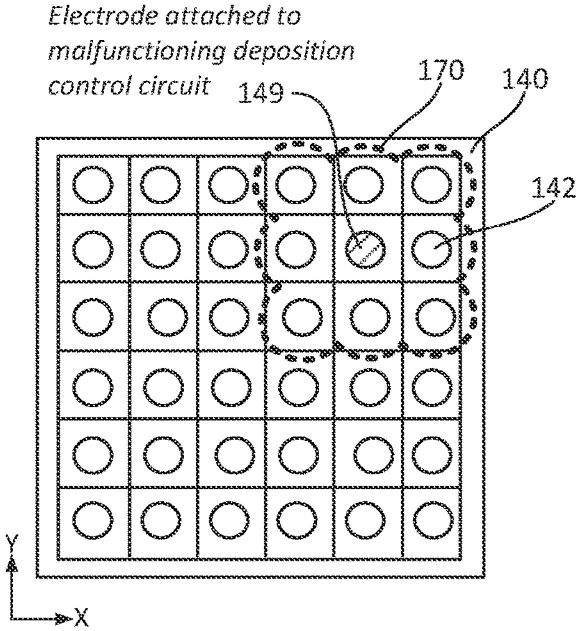

Electrophoretically-deposited mask 170 can take various shapes and can be a single continuous structure or multiple disjoint structures (e.g., patches). FIGS. 4B-4E are top schematic views of different examples of electrophoretically-deposited mask 170 partially covering electrode array 140, in accordance with some examples. Specifically, FIGS. 4B and 4C illustrate examples of electrode array 140 with a single malfunctioning electrode 149. In FIG. 4B, electrophoretically-deposited mask 170 is positioned over and aligned with malfunctioning electrode 149 and does not extend to any adjacent individually-addressable electrodes 142. As such, all of these adjacent electrodes can be used for ELD. When malfunctioning electrode 149 is connected to "stuck on" deposition control circuit 130, this type of selective electrophoretically-deposited mask 170 can be formed by deactivating all deposition control circuits 130 while electrode array 140 is submerged into electrophoretic suspension 190. Electrophoretically-deposited mask 170 is selectively formed only on malfunctioning electrodes 149. For example, malfunctioning electrodes 149 may be identified by observing which electrodes and/or defects are covered by the electrophoretic deposition.

In FIG. 4C, electrophoretically-deposited mask 170 is positioned over malfunctioning electrode 149 and also extends over to adjacent individually-addressable electrodes 142. While FIG. 4B illustrates an extension margin equal to one electrode (from malfunctioning electrode 149), wider extension margins (e.g., two electrodes, three electrodes, or more electrodes) are also within the scope. Furthermore, such extension margins can have different widths in different directions (e.g., extending a different number of pixels in different directions). In this example, electrophoretically-deposited mask 170 covers electrodes that are not malfunctioning, but these electrodes cannot be used for ELD. This type of electrophoretically-deposited mask 170 can be used to ensure that malfunctioning electrode 149 is adequately blocked and there is no current leakage to malfunctioning electrode 149 during ELD. Furthermore, this type of electrophoretically-deposited mask 170 can be formed by purposely activating individually-addressable electrodes 142 while forming electrophoretically-deposited mask 170, i.e., to ensure that electrophoretically-deposited mask 170 extends beyond malfunctioning electrode 149 to these additional individually-addressable electrodes 142. In some examples, this electrophoretically-deposited mask 170 is formed using a two-stage deposition. In the first stage, the initial mask is formed over malfunctioning electrode 149 (e.g., to identify malfunctioning electrode 149). This stage can be used to determine the location of the current-leaking defects, which often may be hard to detect by other means. The second stage involves identifying additional individually-addressable electrodes 142 around malfunctioning electrode 149 where electrophoretically-deposited mask 170 is desired and activating these identified individually-addressable electrodes 142 while forming electrophoretically-deposited mask 170. This aspect may improve adhesion and durability when the electrodes are used in ECAM printing.

Figure 4D:
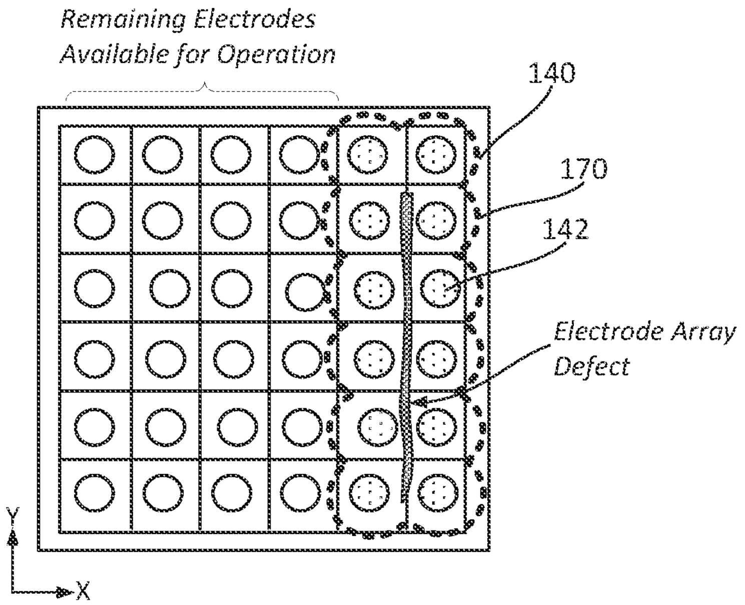

FIG. 4D illustrates an example where an electrode array defect (i.e., the current-leaking defect) does not include any individually-addressable electrodes 142 but extends between these electrodes. One example of such a defect is shown and described above with reference to FIG. 2D. In some examples, a self-aligning electrophoretically-deposited mask may be initially formed to identify this defect. However, this self-aligning mask may not be sufficient to block the current between the defect and electrolyte solution 180. A set of individually-addressable electrodes 142 around the defect can be identified in a manner similar to the example described above with reference to FIG. 4D. Specifically, first electrode set 143 surrounds an electrode array defect.

Figure 4E:
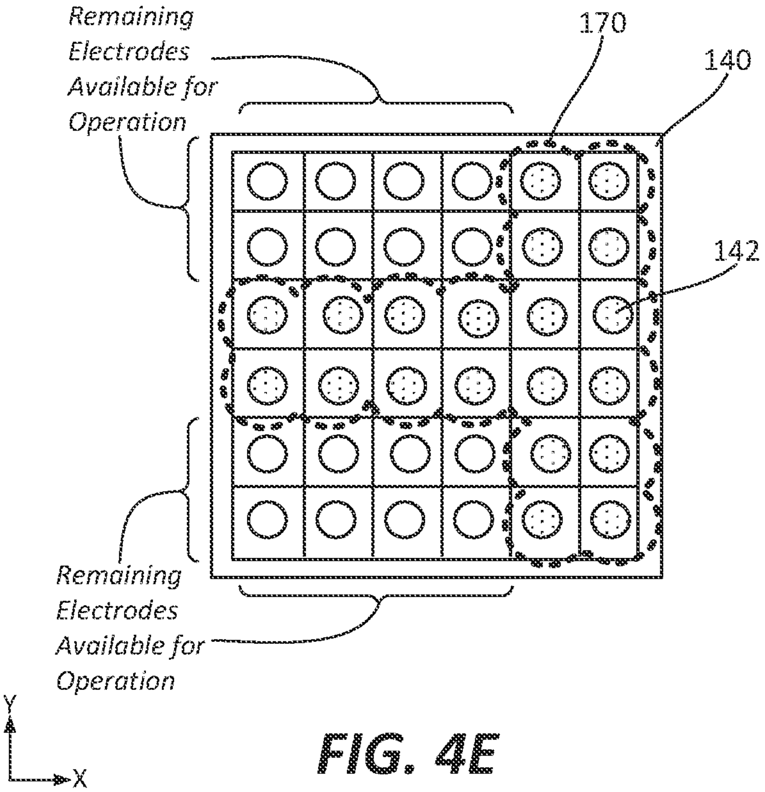

FIG. 4E illustrates an example of electrode array 140 that may not have any malfunctioning electrodes. Electrophoretically-deposited mask 170 is formed to pattern electrode array 140 such that some individually-addressable electrodes 142 do not need to be deactivated during ELD.

In some examples, this process may be used to limit the types of parts that could be fabricated using electrode array 140. In the same or other examples, this process may be used to protect parts of electrode array 140 from possible wear/damage by electrolyte solution 180.

Examples of Electrochemical-Additive Manufacturing Methods

Figure 5:
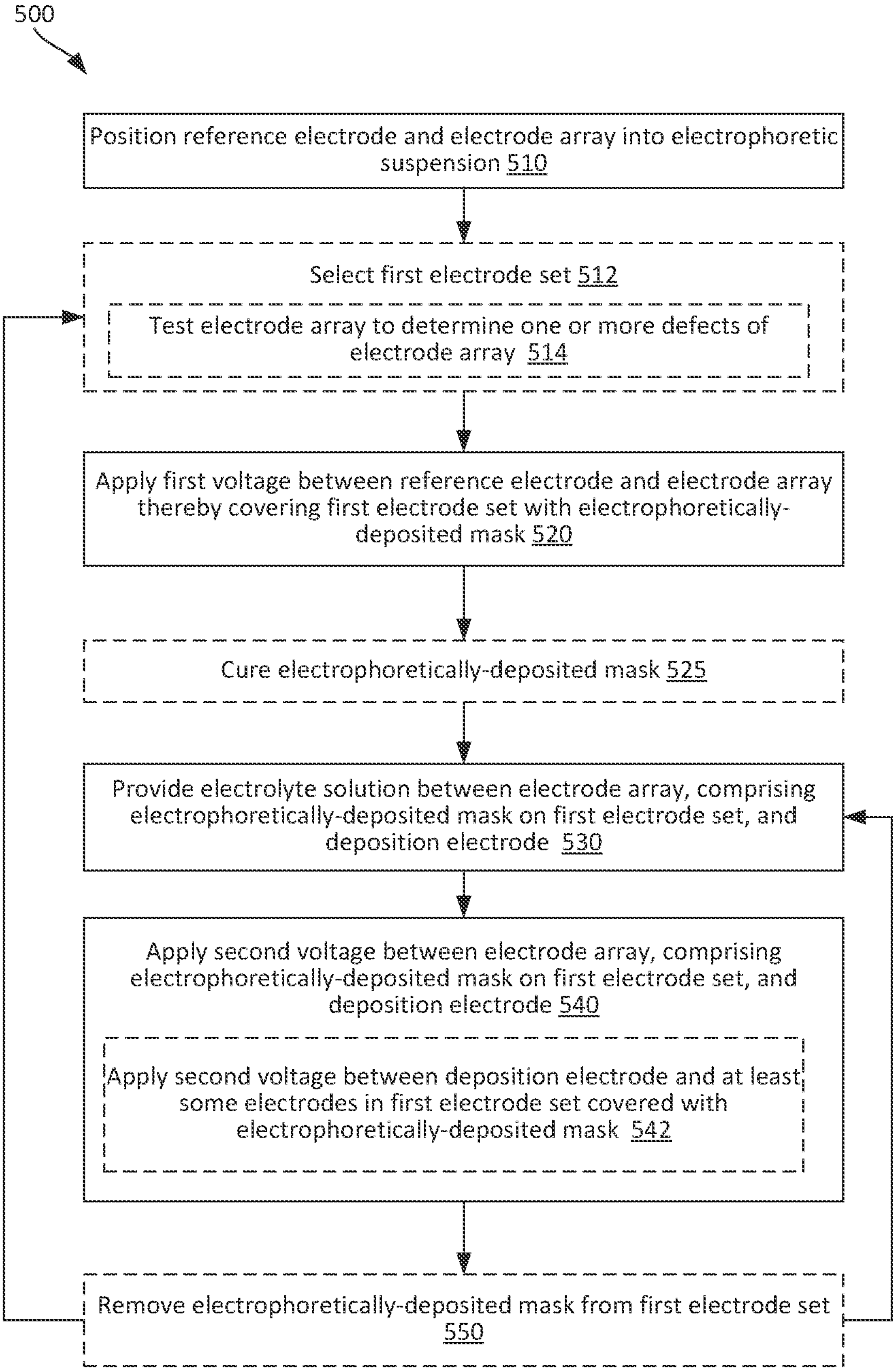
FIG. 5 is a process flowchart corresponding to a method of forming an electrophoretically-deposited mask to selectively cover the individually-addressable electrodes of the electrode array and using this masked electrode array for electrolytically depositing material in an ECAM process, in accordance with some examples.

FIG. 5 is a process flowchart corresponding to ECAM method 500 using ECAM system 100, in accordance with some examples. Various examples of ECAM system 100 are described above. For example, ECAM system 100 comprises deposition power supply 104, electrode array 140 comprising individually-addressable electrodes 142 and deposition control circuits 130, and electrolytic-deposit-receiving electrode 150. In some examples, an additional system (separate from ECAM system 100) is used to form electrophoretically-deposited mask 170 on electrode array 140. Alternatively, ECAM system 100 can be used to form electrophoretically-deposited mask 170 on electrode array 140.

Method 500 comprises (block 510) positioning electrophoretic-deposition-driving electrode 159 and electrode array 140 into electrophoretic suspension 190. Electrophoretic suspension 190 comprises solid charged structures 192 among other components, which are described above with reference to FIG. 3C. During this operation individually-addressable electrodes 142 are in contact with electrophoretic suspension 190. Specifically, individually-addressable electrodes 142 can be submerged into electrophoretic suspension 190 as, e.g., is shown in FIGS. 3A and 3B. In some examples, electrode array 140 is cleaned from any residues (e.g., previously formed electrophoretically-deposited mask 170, remaining electrolyte solution 180, and the like) prior to introducing into electrophoretic suspension 190.

When an additional system (separate from ECAM system 100) is used to form electrophoretically-deposited mask 170 on electrode array 140, electrophoretic-deposition-driving electrode 159 and electrolytic-deposit-receiving electrode 150 are different such that electrophoretically-deposited mask 170 is formed on first electrode set 143 while electrode array 140 is removed from ECAM system 100. Electrode array 140 with electrophoretically-deposited mask 170 is then reinstalled in ECAM system 100 for use in ECAM processes. For example, electrophoretic-deposition-driving electrode 159 is a metal mesh extending proximate to electrode array 140.

Alternatively, electrolytic-deposit-receiving electrode 150 of ECAM system 100 is operable as electrophoretic-deposition-driving electrode 159 while forming electrophoretically-deposited mask 170 on first electrode set 143 such that electrophoretic suspension 190 is provided to ECAM system 100. In other words, the same ECAM system 100 is used to form electrophoretically-deposited mask 170 on electrode array 140 and used for ECAM processed using this electrode array 140 (with electrophoretically-deposited mask 170).

In some examples, electrophoretically-deposited mask 170 is deposited in a self-selecting manner. For example, all deposition control circuits 130 are turned off and only current-passing defects in electrode array 140 determine the deposition locations of electrophoretically-deposited mask 170. Alternatively, the location of electrophoretically-deposited mask 170 is specifically controlled, e.g., by selecting first electrode set 143 based on a desired pattern of electrophoretically-deposited mask 170 on electrode array 140, e.g., as described above with reference to FIGS. 4C-4E above. In these examples, method 500 comprises (block 512) selecting the first electrode set 143. Various methods of selecting first electrode set 143 are within the scope, e.g., performing an initial deposition of electrophoretically-deposited mask 170 in a self-selecting manner. In some examples, (block 512) selecting first electrode set 143 testing electrode array 140 to determine one or more defects of electrode array 140 (e.g., electrical mapping, optical inspection, and the like).

Method 500 proceeds with (block 520) applying a first voltage between electrophoretic-deposition-driving electrode 159 and first electrode set 143. It should be noted that this first voltage may be limited based on the construction of electrode array 140, such as individually-addressable electrodes 142 and deposition control circuits 130. In some examples, the first voltage changes (e.g., increases) during this operation (e.g., as the thickness of electrophoretically-deposited mask 170 increases). Furthermore, the first voltage may depend on the distance between electrophoretic-deposition-driving electrode 159 and first electrode set 143 thereby collectively defining the value of applied fields (e.g., 100V/cm). The duration of this operation may be self-limiting. For example, a micro-current through electrophoretic suspension 190 can be monitored to determine the end of this mask electrophoretic deposition operation. In some examples, the first voltage is greater than the second voltage (used for ELD). It should be noted that the second/ECAM voltage corresponds to the electrochemical potentials of the reactions at each electrode.

As noted above, first electrode set 143 can represent a purposely selected set that requires electrophoretically-deposited mask 170. Alternatively, first electrode set 143 can be self-selected, e.g., by deactivating all deposition control circuits 130. Even with these deactivation steps, some current-leaking defects may be present in electrode array 140 that cause the application of the first voltage between electrophoretic-deposition-driving electrode 159 and parts of electrode array 140. In some examples, these parts of electrode array 140 have no individually-addressable electrodes 142. As such, first electrode set 143 can have zero electrodes in some examples.

When the first voltage is applied between electrophoretic-deposition-driving electrode 159 and first electrode set 143, this voltage drives solid charged structures 192 to first electrode set 143 and forms electrophoretically-deposited mask 170 from solid charged structures 192 on first electrode set 143. As a result, first electrode set 143 becomes covered with an electrophoretically-deposited mask 170.

The insulating material of electrophoretically-deposited mask 170 comprises at least one of ceramic, polymer, or glass.

In some examples, electrophoretically-deposited mask 170 is cured or otherwise processed. For example, electrode array 140 with electrophoretically-deposited mask 170 may be submerged into a rinsing liquid to remove any remaining electrophoretic suspension 190. The curing operation can involve heating electrode array 140 with electrophoretically-deposited mask 170 to a temperature of at least 50° C., at least 75° C., at least 100° C., at least 120° C., or even at least 180° C. This temperature removes any residual electrophoretic suspension solvent 196 and/or crosslink binder 198. In some examples, the post-deposition processing comprises removing (e.g., burning out) binder 198 from electrophoretically-deposited mask 170.

In some examples, method 500 comprises (block 525) curing electrophoretically-deposited mask 170 on first electrode set 143. For example, the deposit formed on first electrode set 143 may include a combination of solid charged structures 192, binder 198, and some residual amounts of electrophoretic suspension solvent 196. The curing operation removes any remaining electrophoretic suspension solvent 196 and, in some examples, causes polymer cross-linking in binder 198. In some examples, the curing operation alters solid charged structures 192, e.g., fusing these particles. In some examples, a first deposit is completed without curing, then a second deposit is completed before performing a cure for both at the same time.

Method 500 proceeds with (block 530) providing electrolyte solution 180 between electrode array 140, comprising electrophoretically-deposited mask 170 on first electrode set 143, and electrolytic-deposit-receiving electrode 150. Specifically, electrode array 140 and electrophoretically-deposited mask 170 on electrode array 140 are submerged into electrolyte solution 180 as, e.g., schematically shown in FIG. 4A. Electrolyte solution 180 comprises cations 183. Additional components of electrolyte solution 180 are described above with reference to FIG. 2B.

Method 500 proceeds with (block 540) applying a second voltage between electrolytic-deposit-receiving electrode 150 and second electrode set 144 of individually-addressable electrodes 142. During this operation, the electric current flows through second electrode set 144, but not through first electrode set 143, covered with electrophoretically-deposited mask 170. Specifically, electrophoretically-deposited mask 170, being electronically isolating, prevents this electric current flow through the first electrode set 143. It should be noted that the activation status of deposition control circuits 130, controlling first electrode set 143, is irrelevant during this operation since electrophoretically-deposited mask 170 provides the current blocking function. For example, deposition control circuits 130, controlling first electrode set 143, can be activated. In this example, applying the second voltage between electrolytic-deposit-receiving electrode 150 and second electrode set 144 further comprises (block 542) applying the second voltage between electrolytic-deposit-receiving electrode 150 and at least some electrodes in first electrode set 143 covered with electrophoretically-deposited mask 170. Even though the second voltage is applied to some electrodes in first electrode set 143, there is no electronic flow through these electrodes since first electrode set 143 covered with electrophoretically-deposited mask 170 and electrophoretically-deposited mask 170 blocks the electronic flow. In other words, a portion of electrode array 140 covered with electrophoretically-deposited mask 170 can continue malfunctioning (e.g., deposition control circuits 130 remain stuck in the "activated" position) without causing any undesirable electrolytic deposits 160 on the portion of electrolytic-deposit-receiving electrode 150 aligned with electrophoretically-deposited mask 170. Alternatively, no voltage may be applied between electrolytic-deposit-receiving electrode 150 and any of the electrodes in first electrode set 143 covered with electrophoretically-deposited mask 170 thereby providing a two-level defense to forming undesirable electrolytic deposits 160.

During this second-voltage application operating, cations 183 flow to and reduce on a second portion 152 of electrolytic-deposit-receiving electrode 150 aligned with second electrode set 144 thereby forming electrolytic deposit 160 on second portion 152 of electrolytic-deposit-receiving electrode 150. However, cations 183 do not reduce on first portion 151 of electrolytic-deposit-receiving electrode 150 aligned with first electrode set 143 thereby keeping first portion 151 free from electrolytic deposit 160.

In some examples, ECAM method 500 further comprises (block 550) removing electrophoretically-deposited mask 170 from first electrode set 143. For example, electrode array 140 with electrophoretically-deposited mask 170 can be positioned in a solvent (e.g., n-methyl-2-pyrrolidone (NMP), to soften the polymer within electrophoretically-deposited mask 170. In some examples, this process may be used to remove electrophoretically-deposited mask 170 (e.g., previously formed to limit the usage of first electrode set 143) to re-enable the use of that electrode set 143 for subsequent prints. In the case of an insufficiently insulating mask, the process may be repeated with changed process parameters.

Experimental Results

An experiment was conducted to form an electrophoretically-deposited mask on an electrode array/print head to identify malfunctioning electrodes. The electrode array was first cleaned in a degreaser followed by rinsing in DI water, 1% $H_2SO_4$ acid-dip, another rinsing in DI water, and air drying. The electrode array was then immersed into an EPD suspension comprising ceramic charged particles (KLIAR-BLU1 from Legor Group in Italy) and agitated back and forth for a few seconds. The electrode array was then powered up such that all deposition control circuits were moved to the inactive state. A programmable power supply (from Korad Technologies in China) was connected to the electrode array and to a stainless-steel reference electrode (which was also submerged into the EPD suspension). The voltage was set to 0-20 V above the active voltage level of the printhead, such that the stainless-steel reference electrode was operable as an anode. The voltage was linearly ramped from 0V to 20V for about 3 minutes, then held at 20V for about 10 minutes, while the EPD solution was stirred. At the start of the process, the current was about 5 mA and then quickly reduced to an unmeasurable level after 15 s as the electrophoretically-deposited mask started adding resistance within this electrical field. It should be noted that, unlike ELD, EPD is not a current-driven process. However, small currents occur due to the charge carried by the charged particles. The electrode array was later disconnected from the power supply and the EPD solution was rinsed with DI water followed by the air dry and curing the electrophoretically-deposited mask formed on the electrode array.

Conclusion

Although the foregoing concepts have been described in some detail for purposes of clarity of understanding, it will be apparent that certain changes and modifications may be practiced within the scope of the appended claims. It should be noted that there are many alternative ways of implementing processes, systems, and apparatuses. Accordingly, the present embodiments are to be considered illustrative and not restrictive.

The invention claimed is:

1. An electrochemical-additive manufacturing method using an electrochemical-additive manufacturing system comprising a deposition power supply, an electrode array comprising individually-addressable electrodes and deposition control circuits, and an electrolytic-deposit-receiving electrode, the method comprising:

positioning an electrophoretic-deposition-driving electrode and the electrode array into an electrophoretic suspension comprising solid charged structures such that the individually-addressable electrodes are in contact with the electrophoretic suspension;

applying a first voltage between the electrophoretic-deposition-driving electrode and a first electrode set of the individually-addressable electrodes, thereby driving the solid charged structures to the first electrode set and forming an electrophoretically-deposited mask from the solid charged structures onto the first electrode set, thereby creating a masked portion of the electrode array covering the first electrode set with the electrophoretically-deposited mask;

providing an electrolyte solution between the electrode array, comprising the electrophoretically-deposited mask on the first electrode set, and the electrolytic-deposit-receiving electrode, wherein the electrolyte solution comprises cations; and applying a second voltage between the electrolytic-deposit-receiving electrode and a second electrode set of the individually-addressable electrodes, wherein:

an electric current flows through the second electrode set, but not through the first electrode set corresponding to the masked portion, the cations do not flow to a first portion of the electrolytic-deposit-receiving electrode aligned with the first electrode set, and the cations flow to and reduce on a second portion of the electrolytic-deposit-receiving electrode aligned with the second electrode set, thereby forming an electrolytic deposit onto the second portion of the electrolytic-deposit-receiving electrode.

2. The electrochemical-additive manufacturing method of claim 1, wherein the electrophoretic-deposition-driving electrode and the electrolytic-deposit-receiving electrode are different.

3. The electrochemical-additive manufacturing method of claim 1, wherein the electrophoretic-deposition-driving electrode is a metal mesh extending proximate to the electrode array.

4. The electrochemical-additive manufacturing method of claim 1, wherein applying the first voltage between the electrophoretic-deposition-driving electrode and the first electrode set of the individually-addressable electrodes comprises:

applying a third voltage to the first electrode set that is at a positive level above an earth ground; and applying a fourth voltage to the electrophoretic-deposition-driving electrode that is at a positive level above earth ground that is greater than the third voltage by an amount equal to the first voltage.

5. The electrochemical-additive manufacturing method of claim 1, wherein:

each of the deposition control circuits is configured to control a flow of current through a corresponding one of the individually-addressable electrodes, and while applying the first voltage between the electrophoretic-deposition-driving electrode and the first electrode set, all of the deposition control circuits of the electrode array are instructed to turn off.

6. The electrochemical-additive manufacturing method of claim 1, further comprising removing the electrophoretically-deposited mask from the first electrode set.

7. The electrochemical-additive manufacturing method of claim 1, wherein:

the electrolytic deposit comprises at least one of copper, nickel, tungsten, gold, silver, cobalt, chrome, iron, or tin; and the electrophoretically-deposited mask comprises at least one of ceramic, polymer, or glass.

8. The electrochemical-additive manufacturing method of claim 1, wherein the first voltage between the electrophoretic-deposition-driving electrode and the first electrode set is greater than the second voltage between the electrolytic-deposit-receiving electrode and the second electrode set.

9. The electrochemical-additive manufacturing method of claim 1, wherein the electrophoretic suspension further comprises a binder.

10. The electrochemical-additive manufacturing method of claim 1, wherein:

each of the deposition control circuits is configured to control a flow of current through a corresponding one of the individually-addressable electrodes, and while applying the first voltage between the electrophoretic-deposition-driving electrode and the first electrode set, all of the deposition control circuits connected to the first electrode set are instructed to turn on thereby allowing for a voltage potential difference between the first electrode set and the electrophoretic-deposition-driving electrode.

11. The electrochemical-additive manufacturing method of claim 10, further comprising selecting the first electrode set based on a desired pattern for the electrode array.

12. The electrochemical-additive manufacturing method of claim 11, wherein the desired pattern for the electrode array is selected based on one or more defects of the electrode array, the one or more defects comprising at least one of (a) a malfunctioning deposition control circuit that fails to disconnect a corresponding individually-addressable electrode from the deposition power supply or (b) an electrode array defect that provides an electronically conductive or ionically conductive pathway through the electrode array.

13. The electrochemical-additive manufacturing method of claim 11, wherein selecting the first electrode set comprises testing the electrode array to determine one or more defects of the electrode array, the one or more defects comprising at least one of (a) a malfunctioning deposition control circuit that fails to disconnect a corresponding individually-addressable electrode from the deposition power supply or (b) an electrode array defect that provides an electronically conductive or ionically conductive pathway through the electrode array.

* * * * *